United States Patent
Bhandarkar et al.

(10) Patent No.: US 7,470,974 B2
(45) Date of Patent: Dec. 30, 2008

(54) SUBSTANTIALLY TRANSPARENT MATERIAL FOR USE WITH LIGHT-EMITTING DEVICE

(75) Inventors: Suhas Bhandarkar, Pleasanton, CA (US); Zhifeng Li, Arlington, MA (US)

(73) Assignee: Cabot Corporation, Boston, MA (US)

( * ) Notice: Subject to any disclaimer, the term of this patent is extended or adjusted under 35 U.S.C. 154(b) by 185 days.

(21) Appl. No.: 11/487,030

(22) Filed: Jul. 14, 2006

(65) Prior Publication Data

US 2008/0012032 A1 Jan. 17, 2008

(51) Int. Cl.
*H01L 23/58* (2006.01)
*H01L 29/24* (2006.01)
*H01L 33/00* (2006.01)

(52) U.S. Cl. .............. 257/632; 257/100; 257/E33.059; 257/E33.06

(58) Field of Classification Search .......... 257/100, 257/632, E33.059, E33.06
See application file for complete search history.

(56) References Cited

U.S. PATENT DOCUMENTS

| | | | |
|---|---|---|---|
| 4,911,903 A | 3/1990 | Unger et al. |
| 4,937,213 A | 6/1990 | Bernier et al. |
| 4,946,608 A | 8/1990 | Segaud |
| 4,990,653 A | 2/1991 | Hayakawa et al. |
| 5,045,575 A | 9/1991 | Gabayson |
| 5,089,455 A | 2/1992 | Ketcham et al. |
| 5,175,199 A | 12/1992 | Asano et al. |
| 5,401,695 A | 3/1995 | Wu |
| 5,618,872 A | 4/1997 | Pohl et al. |
| 5,683,628 A | 11/1997 | Mizuno et al. |
| 5,777,433 A | 7/1998 | Lester et al. |
| 5,783,115 A | 7/1998 | Bilkadi et al. |
| 5,801,884 A | 9/1998 | Sato et al. |
| 5,989,738 A | 11/1999 | Haase et al. |
| 6,030,564 A | 2/2000 | Whitman |
| 6,040,372 A | 3/2000 | Watanabe et al. |
| 6,175,028 B1 | 1/2001 | O'Lenick, Jr. |
| 6,194,481 B1 | 2/2001 | Furman et al. |
| 6,197,863 B1 | 3/2001 | Eck et al. |
| 6,246,123 B1 | 6/2001 | Landers, Jr. et al. |
| 6,329,058 B1 | 12/2001 | Arney et al. |
| 6,350,946 B1 | 2/2002 | Miyake et al. |
| 6,432,526 B1 | 8/2002 | Arney et al. |

(Continued)

FOREIGN PATENT DOCUMENTS

EP        0 803 550 A2      10/1997

(Continued)

OTHER PUBLICATIONS

Caballero et al., "Effect of Residual Phosphorus Left by Phosphate Ester on $BaTiO_3$ Ceramics," *Materials Research Bulletin*, 32(2): 221-229 (1997).

(Continued)

*Primary Examiner*—Ngan Ngo

(57) ABSTRACT

The invention provides a substantially transparent material comprising particles of an inorganic titanate or an inorganic zirconate and at least one compound, wherein the particles are uniformly dispersed in the at least one compound, and wherein the particles are bonded to the at least one compound via at least one surface functional group of the particles. The invention also provides a light emitting device comprising a light emitting diode encapsulated with the substantially transparent material.

15 Claims, 1 Drawing Sheet

U.S. PATENT DOCUMENTS

| | | | |
|---|---|---|---|
| 6,433,359 | B1 | 8/2002 | Kelley et al. |
| 6,528,005 | B2 | 3/2003 | Amagai et al. |
| 6,599,631 | B2 | 7/2003 | Kambe et al. |
| 6,626,987 | B1 | 9/2003 | Suzuki et al. |
| 6,646,022 | B2 | 11/2003 | Okazaki et al. |
| 6,756,236 | B2 | 6/2004 | Ford et al. |
| 6,760,155 | B2 | 7/2004 | Murayama et al. |
| 6,844,950 | B2 | 1/2005 | Ja Chisholm et al. |
| 6,846,435 | B1 | 1/2005 | Bohnen et al. |
| 6,870,311 | B2 | 3/2005 | Mueller et al. |
| 6,887,920 | B2 | 5/2005 | Ohtsuki et al. |
| 6,913,820 | B2 | 7/2005 | Inagaki et al. |
| 6,962,946 | B2 | 11/2005 | Brady et al. |
| 7,169,375 | B2 | 1/2007 | Chisholm |
| 2001/0041784 | A1 | 11/2001 | Amagai et al. |
| 2002/0032250 | A1 | 3/2002 | Okazaki et al. |
| 2002/0192476 | A1 | 12/2002 | Kambe et al. |
| 2003/0060533 | A1 | 3/2003 | Ohtsuki et al. |
| 2003/0124338 | A1 | 7/2003 | Inagaki et al. |
| 2003/0174396 | A1 | 9/2003 | Murayama et al. |
| 2003/0227249 | A1 | 12/2003 | Mueller et al. |
| 2004/0132858 | A1 | 7/2004 | Chisholm et al. |
| 2005/0063898 | A1 | 3/2005 | Ja Chisholm |
| 2005/0107520 | A1 | 5/2005 | Gottschalk-Gaudig et al. |
| 2005/0215164 | A1 | 9/2005 | Mueller et al. |
| 2006/0157248 | A1* | 7/2006 | Hoefer et al. ............... 166/300 |
| 2006/0162771 | A1* | 7/2006 | Inoue et al. ................. 136/263 |
| 2006/0284194 | A1* | 12/2006 | Mishra et al. ................ 257/94 |
| 2007/0104877 | A1* | 5/2007 | Kodas et al. ................ 427/375 |
| 2007/0117271 | A1* | 5/2007 | Kodas et al. ................ 438/122 |
| 2007/0196657 | A1 | 8/2007 | Bhandarkar |

FOREIGN PATENT DOCUMENTS

| | | |
|---|---|---|
| EP | 1 369 935 A1 | 12/2003 |
| EP | 1 510 557 A2 | 3/2005 |
| JP | 2002-097217 A | 4/2002 |
| JP | 2002-097224 A | 4/2002 |
| WO | WO 93/25611 A1 | 12/1993 |
| WO | WO 01/92172 A1 | 12/2001 |
| WO | WO 2005/027576 A2 | 3/2005 |
| WO | WO 2005/110922 A1 | 11/2005 |

OTHER PUBLICATIONS

Cannon et al., "Dispersants for Nonaqueous Tape Casting," *Advances in Ceramics*, 19: 161-174 (1986).

Guerrero et al., "Anchoring of Phosphonate and Phosphinate Coupling Molecules on Titania Particles," *Chem. Mater.*, 13(11): 4367-4373 (2001).

Kim et al., "Interaction of Organophosphorous Compounds With $TiO_2$ and $WO_3$ Surfaces Probed by Vibrational Spectroscopy," *Sensors and Actuators B*, 76: 442-448 (2001).

Kolen'Ko et al., "On the Possibility of Preparing Fine-Particle Barium Zirconate by Hydrothermal Synthesis," *Inorganic Materials*, 38(3): 252-255 (2002).

Ethox Chemicals, LLC, *Material Safety Data Sheet*, 1-3 (Oct. 21, 2005).

Satoh et al., *Journal of Non-Crystalline Solids*, 146: 121-128 (1992).

Suzuki et al., *J. Dent. Res.*, 70(5): 883-888 (May 1991).

\* cited by examiner

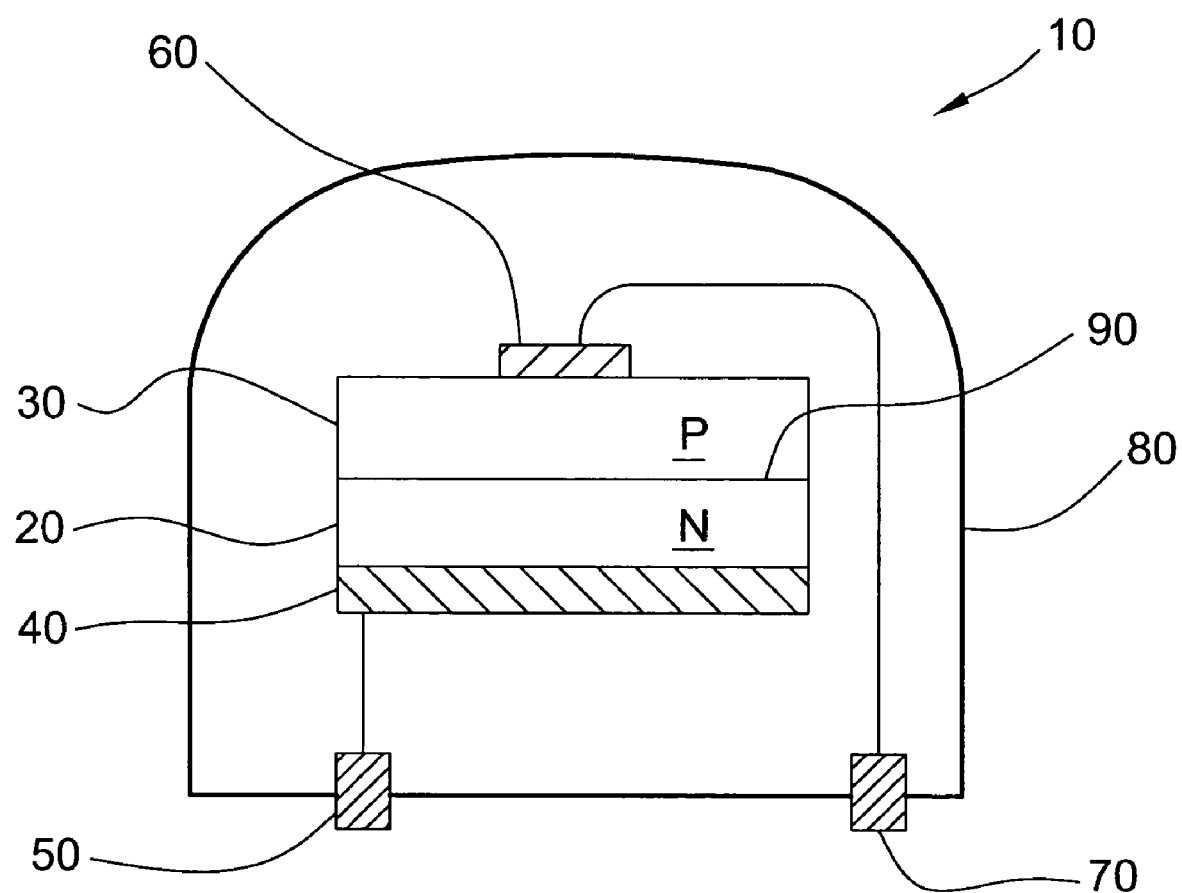

SUBSTANTIALLY TRANSPARENT MATERIAL FOR USE WITH LIGHT-EMITTING DEVICE

FIELD OF THE INVENTION

The invention pertains to substantially transparent materials and light emitting devices comprising the same.

BACKGROUND OF THE INVENTION

Semiconductor light-emitting devices such as light-emitting diodes (LEDs) and laser diodes (LDs) are of great interest as highly efficient and robust light sources. Efforts to extend operation of such devices into the shorter wavelength of the visible spectrum (e.g., from green to violet) have led to use of group III-V semiconductors, particularly binary, ternary, and quaternary alloys of gallium, aluminum, indium, and nitrogen (i.e., III-nitride materials) and binary, ternary, and quaternary alloys of gallium, aluminum, indium, and phosphorus (i.e., III-phosphide materials). In a typical LED, a p-type layer of a semiconductor material is in contact with a n-type layer of the semiconductor material to form an LED chip. Electrodes are attached to each of the layers, and the assembly is typically encapsulated in a substantially transparent material to complete the LED device. When a voltage is applied across the two layers of semiconductor material, the p-n junction of the LED emits light.

A disadvantage associated with current LEDs is that the encapsulating materials typically have a lower refractive index than that of the LED chip. The refractive index of a LED chip is typically between 2.4 and 3.6, while the refractive index of epoxy or plastic encapsulants is typically between 1.4 and 1.6. In order for light to escape the LED device, the light emitted from the LED chip must cross the boundary between the LED chip and the encapsulating material. If the angle of incidence of the light to the boundary between materials is shallower than the critical angle, the light will be reflected back into the LED, due to the phenomenon of total internal reflection, thus diminishing the amount of light that can escape the LED device and diminishing the efficiency of the device. The critical angle is given by the equation: $\theta_c = \sin^{-1}(n_2/n_1)$ wherein $n_1$ is the refractive index of the LED chip and $n_2$ is the refractive index of the encapsulating material. Therefore, an encapsulating material having a low refractive index $n_2$ will have a decreased critical angle $\theta_c$ compared to an encapsulating material having a higher refractive index $n_2$, thereby increasing the amount of light lost to total internal reflection.

In addition, when light crosses a boundary between media of two different refractive indices, a portion of the light is reflected back from the interface between the two media due to the difference in refractive indices. This phenomenon is known as Fresnel reflection or Fresnel loss. The amount of Fresnel loss is greater with a greater difference in refractive index between the two media. Although the amount of light loss due to Fresnel reflection is less than the amount of light loss due to total internal reflection, the Fresnel loss accounts for a significant loss of light produced by the LED device. If the refractive index of the encapsulating material could be increased, thereby decreasing the difference between the refractive indices of the LED chip and the encapsulating material, Fresnel loss would be reduced.

Attempts have been made to produce encapsulating materials for LEDs having higher refractive indices than current epoxies and other polymers. For example, chalcogenide glasses have been investigated as encapsulants for LEDs. However, difficulties in processing such glasses make them unsuitable for mass production. The incorporation of nanoparticles of high refractive index such as titanium dioxide into polymeric host materials has been reported in U.S. Pat. No. 5,777,433. However, the titanium dioxide particles tend to aggregate and/or agglomerate during incorporation into the host material, requiring treatment with an anti-flocculant coating prior to mixing with the host material. In addition, the requirement for a low refractive index host material and the limitation on the amount of high refractive index nanoparticles that can be incorporated into the host material without subsequent aggregation and/or agglomeration limits the utility of such an approach.

Further, as LEDs are being developed to generate higher light output, the increased power necessary to generate such higher light outputs result in higher operating temperatures for LED devices. Increasing the amount of extractable light generated by LED devices would allow for a reduction in power required for a given light output, with attendant reduction in operating temperatures.

The invention provides an encapsulating material and a light emitting device comprising the same. These and other advantages of the invention, as well as additional inventive features, will be apparent from the description of the invention provided herein.

BRIEF SUMMARY OF THE INVENTION

The invention provides a substantially transparent material comprising (a) particles of an inorganic titanate or an inorganic zirconate having a median particle diameter of about 4 nm to about 15 nm, and (b) at least one compound, wherein the particles are uniformly dispersed in the at least one compound, wherein the particles are bonded to the at least one compound via at least one surface functional group of the particles, and wherein the substantially transparent material has a viscosity of about 30,000 centipoise or more at a shear rate of 0.1 s$^{-1}$.

The invention also provides a light emitting device comprising (a) a light emitting diode that emits light, and (b) a material that encapsulates the light emitting diode that is substantially transparent to the emitted light, which material comprises (i) particles of an inorganic titanate or an inorganic zirconate, and (ii) at least one compound, wherein the particles are uniformly dispersed in the at least one compound, wherein the particles are bonded to the at least one compound via at least one surface functional group of the particles, and wherein the substantially transparent material has a viscosity of about 30,000 centipoise or more at a shear rate of 0.1 s$^{-1}$.

BRIEF DESCRIPTION OF THE SEVERAL VIEWS OF THE DRAWING(S)

The FIGURE is a schematic view of a light emitting device having an LED chip encapsulated by a substantially transparent material in accordance with one embodiment of the invention.

DETAILED DESCRIPTION OF THE INVENTION

The invention provides a substantially transparent material. The substantially transparent material comprises, consists essentially of, or consists of (a) particles of an inorganic titanate or an inorganic zirconate having a median particle diameter of about 4 nm to about 15 nm, and (b) at least one compound. The particles are uniformly dispersed in the at least one compound and are bonded to the at least one compound via at least one surface functional group of the particles. The substantially transparent material has a viscosity of about 30,000 centipoise or more at a shear rate of $0.1\ s^{-1}$.

The substantially transparent material desirably is transmissive to incident light radiation at a desired wavelength or range of wavelengths. The substantially transparent material desirably allows a light transmission of about 75% or more (e.g., about 80% or more, or about 85% or more, or about 90% or more) of a beam of light having a wavelength of 400 nm directed to the substantially transparent material at a specular angle of 10° as well as, desirably at a specular angle of 7.5°, 5°, or less than 5°, through a thickness of 2 mm of the substantially transparent material. Typically, the substantially transparent material is amorphous and will not comprise any crystalline phase or phases that can contribute materially to the scattering of light. A crystalline phase refers to a bulk region or regions of the substantially transparent material comprising the compound and particles, wherein the compound having particles bonded thereto forms a crystalline phase comprising a plurality of molecules of the compound arranged in a crystalline lattice, and not to the crystallinity of the particles themselves. Because the particles have a median particle diameter that is less than one-twentieth the wavelength of visible light, light scattering by the particles is minimal.

The particles and the compound have a first and a second refractive index, respectively. The refractive index of the particles typically is about 2.0 or more (e.g., about 2.1 or more, or about 2.2 or more), and the refractive index of the compound typically is about 1.4 to about 1.6. The refractive index of the substantially transparent material can be approximated by a volume weighted average of the refractive indices of its components, if the substantially transparent material can be treated as a host material comprising other materials that do not scatter light. Thus, the refractive index of the substantially transparent material may be given by the equation:

$$n = \frac{\sum_i v_i n_i}{\sum_i v_i}$$

wherein $v_i$ is the volume fraction and $n_i$ is the refractive index, respectively, of component i.

The substantially transparent material, therefore, will have a refractive index with a value between the refractive index of the particles and the refractive index of the compound, and the refractive index of the material will depend on the volume-weighted amounts of the particles and the compound.

The particles are selected from the group consisting of inorganic titanates and inorganic zirconates. Preferably, inorganic titanates are selected from the group consisting of barium titanate, strontium titanate, potassium titanate, and lead titanate. More preferably, the inorganic titanate is barium titanate or strontium titanate. Preferably, inorganic zirconates are selected from the group consisting of barium zirconate, strontium zirconate, potassium zirconate, and lead zirconate. More preferably, the inorganic zirconate is barium zirconate or strontium zirconate.

The particles have a median particle diameter of about 4 nm or more (e.g., about 5 nm or more, or about 6 nm or more). The particles also have a median particle diameter of about 15 nm or less (e.g., about 14 nm or less, or about 13 nm or less). In this regard, particle diameter refers to the diameter of the smallest sphere that encloses the particle. The median particle diameter refers to the particle diameter which represents the median of the particle size distribution and refers to the particle diameter when the particles are dispersed in the at least one compound.

As is well known in the art, many particles comprise, at the lowest level of structure, primary particles. Primary particles are formed by covalent bonds or ionic bonds between atoms comprising the particles and are stable to all but the harshest conditions. At the next level of structure, primary particles can be associated into secondary particles, generally referred to as aggregates. Aggregate particles comprise primary particles and are bonded together by covalent bonds and ionic bonds, and typically are resistant to degradation by, e.g., mechanical energy inputs such as high-shear mixing. At the next level of structure, aggregates can be more loosely associated into agglomerates. Typically, agglomerates can be disassociated into the constituent aggregates via mechanical energy inputs. Desirably, when the particles are dispersed in the at least one compound, the particles are substantially present as primary particles and are substantially nonaggregated and/or nonagglomerated. The particles can be crystalline or amorphous. As used herein, median particle diameter refers to the median particle diameter of the primary particles.

The particles preferably have a particle size distribution wherein about 80 vol. % or more (e.g., about 85 vol. % or more, or about 90 vol. % or more, or even about 95 vol. % or more) of the particles have a particle diameter of about 20 nm or less.

The particle size distribution, and thus the median particle size, and can be determined by any suitable technique. A particularly suitable method for the determination of particle size distribution for nanoparticles (e.g., particles having a particle diameter ranging from about 1 nm to about 5000 nm) is dynamic light scattering, also known as photon correlation spectroscopy. Several particle sizing instruments utilizing dynamic light scattering as the analytical method are commercially available from suppliers such as Malvern Instruments (Malvern, UK), Particle Sizing Systems (Santa Barbara, Calif.), and Micromeritics Instrument Corporation (Norcross, Ga.). In addition, the particle size distribution can be determined by using scanning electron microscopy (SEM) or transmission electron microscopy (TEM) in conjunction with commercially available image software such as Optimas 6.1 (Media Cybernetics, Inc., Silver Spring, Md.).

The inorganic titanates and inorganic zirconates can be prepared by any suitable method capable of producing particles having the desired particle size distribution. Examples of methods useful in producing inorganic titanates and inorganic zirconates capable of producing nanometer-scale particles having a controlled particle size distribution include sol-gel processes and hydrothermal processes. Sol-gel processes typically involve reaction of a suitable metal precursor, wherein the metal is selected from the group consisting of barium, strontium, potassium and lead, such as a metal alkoxide or metal salt (e.g., metal acetate or metal halide), with a titanium alkoxide or zirconium alkoxide in the presence of a suitable solvent at elevated temperature. Suitable titanium alkoxides and zirconium alkoxides include titanium tetraethoxide, titanium tetra-isopropoxide, titanium tetrabutoxide, zirconium tetraethoxide, zirconium tetra-isopropoxide, zirconium tetrabutoxide, and the like. Sol-gel processes can be conducted in the presence of water such that the metal precursor and titanium alkoxide or zirconium alkoxide undergo hydrolysis followed by condensation of the hydrolyzed species to produce the inorganic titanate or inorganic zirconate, which is then recovered from the reaction mixture to provide the inorganic titanate or inorganic zirconate.

Hydrothermal processes typically involve treatment of a titania or a zirconia source, such as titanium or zirconium alkoxides, oxides, or oxide gels with metal salts, wherein the metal is selected from the group consisting of barium, strontium, potassium, and lead, in a strongly alkaline aqueous solution at temperatures ranging from about 60° C. to about 500° C. for a period of time sufficient to produce the inorganic titanates and inorganic zirconates. Control of particle size can be effected by the reaction time and the reaction temperature employed. In a variation of a hydrothermal process, a titanium oxide precursor such as titanium dioxide or titanium oxide gel can be treated with a solution of the metal salt in a strongly basic aqueous solution at elevated temperatures to provide the inorganic titanates. An example of hydrothermal synthesis of nanoparticulate barium zirconate is described in Kolen'ko et al., *Inorganic Materials*, 38: 252-255 (2002).

A preferred process for producing the particles is aqueous precipitation, which process generally involves combining a hot aqueous solution of a first metal hydroxide $M(OH)_x$, wherein M is selected from the group consisting of barium, strontium, potassium, and lead, and x is an integer of 1 to 4, with a hot aqueous solution of titanium hydroxide or zirconium hydroxide (e.g., $Ti(OH)_4$ or $Zr(OH)_4$), and then allowing the combined solutions to cool, thereby forming particles of metal titanates or metal zirconates. The median particle size and the particle size distribution of the particles thus obtained can be controlled by concentration of the components in solution, the temperature at which the solutions comprising the components are mixed, the rate of cooling of the solution of components, the length of time the solution is kept before further processing, and the like. Mixing solutions comprising the first metal hydroxide and the titanium hydroxide or zirconium hydroxide at higher temperatures tends to produce particles having a lower median particle size than particles formed at a lower temperature.

The substantially transparent material comprises at least one compound. The particles are uniformly dispersed in the at least one compound, and the particles are bonded to the at least one compound via at least one surface functional group of the particles.

The compound can be any suitable compound provided that the compound has at least one functional group that forms a bond to a least one surface functional group of the particles. Advantageously, formation of a bond between the particles and the compound provides stability of the particles in the compound and prevents aggregation and/or agglomeration of the particles in the compound. The bond can be any suitable bond and typically is a bond selected from the group consisting of an electrostatic interaction, a covalent bond, a coordinative bond, and combinations thereof. Preferably, the compound is a heat-stable compound. For example, the compound typically will sustain a temperature of about 200° C. for an extended period of time (e.g., 24 hours). Stability of the compound in the context of the invention refers to the integrity of the compound molecules over time to degradative processes such as oxidation, resistance to cleavage to smaller molecular weight fragments, and the ability of the compound to maintain a bond to the at least one surface functional group of the particles.

The compound can have any suitable molecular weight. Typically, the compound has a molecular weight of about 300 Daltons or more (e.g., about 350 Daltons or more, or about 400 Daltons or more, or about 500 Daltons or more). Preferably, the compound has a molecular weight of about 10,000 Daltons or less (e.g., about 7500 Daltons or less, or about 5000 Daltons or less, or about 2500 Daltons or less, or even about 1000 Daltons or less).

In one embodiment, the compound is an organic phosphate. The compound can be any suitable organic phosphate. The organic phosphate can be characterized by the structure $R^1O—P(=O)(OR^2)(OR^3)$ wherein $R_1$ is selected from the group consisting of $C_1$-$C_{30}$ alkyl, $C_1$-$C_{30}$ alkenyl, $C_1$-$C_{30}$ alkynyl, $C_6$-$C_{30}$ aryl, $C_7$-$C_{30}$ alkylaryl, $C_7$-$C_{30}$ arylalkyl, $R^4(OR^5)_n$— wherein $R^4$ is a $C_1$-$C_{30}$ alkyl, $C_1$-$C_{30}$ alkenyl, $C_1$-$C_{30}$ alkynyl, $C_6$-$C_{30}$ aryl, $C_7$-$C_{30}$ alkyaryl, or $C_7$-$C_{30}$ arylalkyl group, $R^5$ is a $C_2$-$C_4$ alkylene group (e.g., ethylene, propylene, or butylene), and n is an integer of from 1 to about 20, and a group comprising a polysiloxane moiety comprising the repeating group $R^4—(OSiR^6R^7)_p$— wherein $R^4$ is as defined herein and $R^6$ and $R^7$ are independently selected from the group consisting of $C_1$-$C_{30}$ alkyl, $C_1$-$C_{30}$ alkoxy, $C_1$-$C_{30}$ alkenyl, $C_1$-$C_{30}$ alkenyloxy, $C_1$-$C_{30}$ alkynyl, $C_1$-$C_{30}$ alkynyloxy, $C_6$-$C_{30}$ aryl, $C_7$-$C_{30}$ alkylaryl, $C_7$-$C_{30}$ alkylaryloxy, $C_7$-$C_{30}$ arylalkyl, $C_7$-$C_{30}$ arylalkyloxy, and $C_7$-$C_{30}$ aryloxyalkyl, and wherein p is an integer from 1 to about 50; and $R^2$ and $R^3$ are independently hydrogen or a $C_1$-$C_{10}$ alkyl. In a preferred embodiment, $R^2$ and $R^3$ are both hydrogen. Non-limiting examples of suitable organic phosphates include polyoxyethylenedecyl ether phosphates such as Ethfac 161 (Ethox Chemicals, Greenville, S.C.), $C_{11}$-$C_{14}$ ethoxylated phosphates such as PS131 (Akzo Nobel, Arnhem, The Netherlands), polyethylene nonyl phenyl ether phosphates such as STEPFAC 8171 (Stepan Company, Northfield, Ill.). Non-limiting examples of suitable organic phosphonates comprising polysiloxane moieties include silicone alkyl phosphates as disclosed in U.S. Pat. No. 6,175,028 and compounds of the structure $CH_3(Si(CH_3)_2O)_xP(=O)(OH)_2$ wherein x is an integer of about 10 to about 25.

In another embodiment, the compound is an organic phosphonate. Organic phosphonates are characterized by the structure $R^1—P(=O)(OR^2)(OR^3)$ wherein $R_1$ is selected from the group consisting of $C_1$-$C_{30}$ alkyl, $C_1$-$C_{30}$ alkenyl, $C_1$-$C_{30}$ alkynyl, $C_6$-$C_{30}$ aryl, $C_7$-$C_{30}$ alkylaryl, $C_7$-$C_{30}$ arylalkyl group, $R^4(OR^5)_n$— wherein $R^4$ is a $C_1$-$C_{30}$ alkyl, $C_1$-$C_{30}$ alkenyl, $C_1$-$C_{30}$ alkynyl, $C_6$-$C_{30}$ aryl, $C_7$-$C_{30}$ alkyaryl, or $C_7$-$C_{30}$ arylalkyl group, $R^5$ is a $C_2$-$C_4$ alkylene group (e.g., ethylene, propylene, or butylene), and n is an integer of from 1 to about 20, and a group comprising a polysiloxane moiety comprising the repeating group $R^4—(OSiR^6R^7)_p$— wherein $R^4$ is as defined herein and $R^6$ and $R^7$ are independently selected from the group consisting of $C_1$-$C_{30}$ alkyl, $C_1$-$C_{30}$ alkoxy, $C_1$-$C_{30}$ alkenyl, $C_1$-$C_{30}$ alkenyloxy, $C_1$-$C_{30}$ alkynyl, $C_1$-$C_{30}$ alkynyloxy, $C_6$-$C_{30}$ aryl, $C_7$-$C_{30}$ alkylaryl, $C_7$-$C_{30}$ alkylaryloxy, $C_7$-$C_{30}$ arylalkyl, $C_7$-$C_{30}$ arylalkyloxy, and $C_7$-$C_{30}$ aryloxyalkyl, and wherein p is an integer from 1 to about 50; and $R^2$ and $R^3$ are independently hydrogen or a $C_1$-$C_{10}$ alkyl. In a preferred embodiment, $R^2$ and $R^3$ are both hydrogen. Non-limiting examples of an organic phosphonate include octadecyl phosphonic acid, tetradecyl phosphonic acid, and docosyl phosphonic acid. Non-limiting examples of silicone-containing phosphonic acids include compounds of the structure $CH_3(Si(CH_3)_2O)_xCH_2P(=O)(OH)_2$ wherein x is an integer of about 10 to about 25.

In another embodiment, the compound is an organic phosphinate. Organic phosphinates are characterized by the structure $R^1—P(=O)(H)(OR^2)$ wherein $R_1$ is selected from the group consisting of $C_1$-$C_{30}$ alkyl, $C_1$-$C_{30}$ alkenyl, $C_1$-$C_{30}$ alkynyl, $C_6$-$C_{30}$ aryl, $C_7$-$C_{30}$ alkylaryl, $C_7$-$C_{30}$ arylalkyl group; a polyoxyethylene group, a polyoxypropylene group, $R^4(OR^5)_n$— wherein $R^4$ is a $C_1$-$C_{30}$ alkyl, $C_1$-$C_{30}$ alkenyl, $C_1$-$C_{30}$ alkynyl, $C_6$-$C_{30}$ aryl, $C_7$-$C_{30}$ $C_7$-$C_{30}$ alkylaryl, or $C_7$-$C_{30}$ arylalkyl group, $R^5$ is a $C_2$-$C_4$ alkylene group (e.g., ethylene, propylene, or butylene), and n is an integer of from 1 to about 20, and a group comprising a polysiloxane moiety comprising the repeating group $R^4$—$(OSiR^6R^7)_p$— wherein $R^4$ is as defined herein and $R^6$ and $R^7$ are independently selected from the group consisting of $C_1$-$C_{30}$ alkyl, $C_1$-$C_{30}$ alkoxy, $C_1$-$C_{30}$ alkenyl, $C_1$-$C_{30}$ alkynyloxy, $C_1$-$C_{30}$ alkynyl, $C_1$-$C_{30}$ alkynyloxy, $C_6$-$C_{30}$ aryl, $C_7$-$C_{30}$ alkylaryl, $C_7$-$C_{30}$ alkylaryloxy, $C_7$-$C_{30}$ arylalkyl, $C_7$-$C_{30}$ arylalkyloxy, and $C_7$-$C_{30}$ aryloxyalkyl, and wherein p is an integer from 1 to about 50; and $R_2$ and $R_3$ are independently hydrogen or a $C_1$-$C_{10}$ alkyl. Non-limiting examples of an organic phosphonate include octadecyl phosphinic acid, tetradecyl phosphinic acid, and docosyl phosphinic acid. Non-limiting examples of silicone-containing phosphinic acids include compounds of the structure $CH_3(Si(CH_2)_2O)_xCH_2P(\!=\!O)(H)(OH)$ wherein x is an integer of about 10 to about 25.

In another embodiment, the compound is an organic zirconate. Organic zirconates are characterized by the structure $(R^1O)(R^2O)(R^3O)(R^4O)Zr$ wherein $R^1$, $R^2$, $R^3$, and $R^4$ are independently selected from the group consisting of $C_1$-$C_{30}$ alkyls and wherein $R_1$ and $R^2$ and/or $R^3$ and $R^4$ taken together form a cyclic structure. Non-limiting examples of suitable organic zirconates include octyleneglycolzirconate, tetra-2-ethylhexylzirconate, tetraisopropylzirconate, tetrabutylzirconate, and tertiarybutyltrimethylzirconate.

When the substantially transparent material does not substantially comprise any components other than the particles and the at least one compound, the substantially transparent compound typically comprises about 40 wt. % or more (e.g., about 45 wt. % or more, about 50 wt. % or more, or about 55 wt. % or more) of the particles, and typically comprises about 60 wt. % or less (e.g., about 55 wt. % or less, or about 50 wt. % or less) of the compound. As noted above, the refractive index of the substantially transparent material can be maximized by maximizing the amount of particles in the substantially transparent material. One factor affecting the total amount of particles in the substantially transparent material is the surface area per unit volume of the particles. As the median particle diameter of the particles decreases, the surface area per unit volume of the particles increases, and therefore the number of surface functional groups available for bonding to the compound increases. Since the compound and particles form bonds therebetween, in order to form a stable dispersion of the particles in the compound, there must be sufficient compound in order to form a sufficient number of bonds to the particles, which limits the amount of particles, for a given surface area, that can be incorporated into the substantially transparent material.

The substantially transparent material desirably has a viscosity of about 30,000 centipoise or more (e.g., about 50,000 centipoise or more, or about 75,000 centipoise or more, or about 100,000 centipoise or more) at a shear rate of $0.1\ s^{-1}$. The viscosity can be measured using a commercially available viscosimeter, for example, the Brookfield Dial Viscosimeter or the Wells-Brookfield cone/plate viscosimeter (Brookfield Engineering Labs., Inc., Middleboro, Mass.). Advantageously, the substantially transparent material has a viscosity such that the substantially transparent material has sufficient mechanical strength to maintain a desired shape over time.

The substantially transparent material can be prepared by any suitable method. For example, the particles can be dispersed in water with high shear mixing. A solution of the compound in a water-immiscible solvent is then added and stirring continued until the particles have been transferred from the aqueous phase into the organic phase. Non-limiting examples of suitable solvents include toluene, xylenes, ethyl acetate, heptane, and hexane. The organic phase is then separated and the solvent removed to provide the substantially transparent material. The solvent can be removed using any suitable technique, for example, by rotary evaporation, simple distillation, open-dish evaporation, and reduced pressure evaporation.

Alternatively, the particles can be dispersed in an aqueous medium, or obtained as synthesized as a dispersion in an aqueous medium, and then flocculated into agglomerates by addition of an agent that alters the surface charge of the particles, for example, by adjusting the pH or by addition of a multivalent cation. The agglomerated particles are then separated from the aqueous medium by methods including, for example, centrifugation or filtration. The agglomerated particles are added to a mixture of the compound and a solvent that dissolves the compound. The resulting mixture of agglomerated particles, compound, and solvent are then subjected to deagglomeration by methods including but not limited to high-shear mixing, jet milling, media milling, and the like. Following deagglomeration, the solvent is removed to provide the substantially transparent material. Suitable solvents and methods for solvent removal are as recited above. As the particles are deagglomerated in the presence of the compound, bond formation between the particles and the compound prevent reagglomeration of the particles, thereby advantageously providing for a homogeneous dispersion of the particles, preferably as primary particles, in the compound.

The substantially transparent material optionally further comprises particles of titanium dioxide. The particles of titanium dioxide can have any suitable form, including rutile, anatase, brookite, and titanium dioxide (B). Typically, the particles of titanium dioxide have a median particle diameter of about 4 nm or more (e.g., about 5 nm or more, or about 6 nm or more). Preferably, the particles of titanium dioxide have a median particle diameter of about 15 nm or less (e.g., about 14 nm or less, or about 13 nm or less). Desirably, the particles of titanium dioxide are uniformly dispersed in the at least one compound and are bonded to the at least one compound via at least one surface functional group of the particles of titanium dioxide. As with the particles of inorganic titanate or inorganic zirconate, the bond can be any suitable bond and typically is a bond selected from the group consisting of an electrostatic interaction, a covalent bond, a coordinative bond, and combinations thereof.

The particles of titanium dioxide preferably have a particle size distribution wherein about 80% or more (e.g., about 85% or more, or about 90% or more, or even about 95% or more) of the particles have a particle diameter of about 20 nm or less.

When the substantially transparent material further comprises particles of titanium dioxide, typically the substantially transparent material comprises about 10 wt. % or less (e.g., about 5 wt. % or less) of the particles of titanium dioxide.

In one embodiment, the substantially transparent material comprises about 10 wt. % or less (e.g., about 8 wt. % or less, or about 5 wt. % or less) of any component other than the particles and the at least one compound. In a limiting embodiment, the substantially transparent material comprises substantially no component other than the particles and the at least one compound (e.g., about 2 wt. % or less, or about 1 wt. % or less, or even 0 wt. %).

In other embodiments, the particles and the at least one compound are uniformly blended with a host material to form a substantially homogeneous blend. The host material can be any suitable material. Preferably, the host material is heat-stable. For example, the host material typically will sustain a temperature of about 200° C. for an extended period of time (e.g., 24 hours) without degradation. Stability of the host material in the context of the invention refers to the integrity of the host material over time to degradative processes such as oxidation, resistance to cleavage to smaller molecular weight fragments, and the ability of the host material to maintain a uniform blend with the substantially transparent material over time.

Desirably, the host material is substantially transparent, wherein the term "substantially transparent" is as herein defined. Typically, the host material is a polymer. Generally, the polymer will be selected to have a flow temperature that is above the maximum operating temperature that the conductive film will be subjected to while in use. The polymer can be amorphous, semi-crystalline, or crystalline. The flow temperature of the polymer is preferably about 200° C. or higher (e.g., about 250° C. or higher, or even about 300° C. or higher). Preferably, the polymer is selected from the group consisting of silicone polymers, polyarylene ethers, polyetheretherketone, polyetherketoneketone, polyetherimide, cyclized polyimides, fluorinated polyimides, polybenzimidazole, polybenzoxazole, polyolefins, polycarbonates, polyimides, polyesters, cyclic polyolefins, and elastomers.

The particles and the at least one compound can be blended with the host material using any suitable mechanical blending process, or by mixing in solution. Non-limiting examples of suitable mechanical blending processes include screw extrusion and use of a conventional three-roll mill. The particles and the at least one compound can be mixed with the host material in solution by dissolving or suspending the components of the substantially transparent material in a solvent to obtain a homogeneous solution, and then removing the solvent to obtain the blend. The components can be dissolved in the same volume of solvent, or the components can be separately dissolved in the same solvent or in two or more different solvents (e.g., the particles and the at least one compound in a first solvent, and the host material in a second solvent) to obtain separate solutions that subsequently are combined to obtain a single solution containing all of the components. The solvent is then removed to provide the blend. The solvent can be removed as described herein. The particles can be bonded to the at least one compound prior to combining with the host material, such that a solution of the compound-bonded particles is mixed with the host material, or the substantially transparent material can be prepared by mixing the particles, at least one compound, and host material simultaneously, in the presence or absence of a solvent.

The invention also provides a light emitting device comprising (a) a light emitting diode that emits light, (b) a material that encapsulates the light emitting diode that is substantially transparent to the emitted light, which material comprises (i) particles of an inorganic titanate or an inorganic zirconate, and (ii) at least one compound, wherein the particles are uniformly dispersed in the at least one compound, wherein the particles are bonded to the at least one compound via at least one surface functional group of the particles, and wherein the material has a viscosity of about 30,000 centipoise or more at a shear rate of 0.1 s$^{-1}$. The material that encapsulates the light emitting diode that is substantially transparent to the emitted light is the substantially transparent material as described herein.

The FIGURE shows a LED device (10) comprising a LED chip encapsulated by a substantially transparent material in accordance with one embodiment of the invention. A n-type layer (20) is in contact with an p-type layer (30) which together form the LED chip. The n-type layer (20) is in contact with a conductive metal layer (40) which is electrically connected to electrical contact (50). The p-type layer (30) is in contact with a conductive metal layer (60) which is electrically connected to electrical contact (70). The LED chip is encapsulated by the substantially transparent material (80). When an electrical voltage is applied across the electrical contacts (50) and (70), the p-n junction (90) generates light, a portion of which is emitted into the encapsulant (80) via the exposed portion of the p-type layer (30).

Advantageously, the high refractive index of the substantially transparent material allows for increased extraction of light from the LED chip because of decreased losses due to total internal reflection and Fresnel loss as compared with many other materials. In addition, the improved dispersion of the particles in the compound of the substantially transparent material due to bonding of the particles to the compound prevents aggregation and/or agglomeration of the particles to form large aggregates and/or agglomerates having diameters that are greater than about ½₀ of the wavelength of the transmitted light that contribute to light scattering and attendant losses. The substitution of optional particles of titanium dioxide having a refractive index of about 2.7 for a portion of the particles having a lower refractive index allows for preparation of a substantially transparent material having an increased refractive index. Further, when the substantially transparent material further comprises a polymer, the overall cost of the substantially transparent material can be reduced by allowing for use of a lower amount of the particles and the at least one compound per unit volume of the substantially transparent material, at a cost of reducing the refractive index of the substantially transparent material. Moreover, selection of a polymer having a high flow temperature and good stability at high temperatures for incorporation into the substantially transparent material allows for the preparation of a substantially transparent material that is useful at higher temperatures or that has different mechanical properties.

The substantially transparent material is suitable for use in many additional applications requiring substantial transparency and a high refractive index. In addition to light emitting devices such as LED devices and laser diodes, examples of useful products include but are not limited to lenses and light transmission devices.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A substantially transparent material comprising:
   (a) particles of an inorganic titanate or an inorganic zirconate having a median particle diameter of about 4 nm to about 15 nm, and
   (b) at least one compound,
   wherein the particles are uniformly dispersed in the at least one compound, wherein the particles are bonded to the at least one compound via at least one surface functional group of the particles, and wherein the substantially transparent material has a viscosity of about 30,000 centipoise or more at a shear rate of 0.1 $s^{-1}$.

2. The substantially transparent material of claim 1, wherein about 80 vol. % or more of the particles have a particle diameter of about 20 nm or less.

3. The substantially transparent material of claim 1, wherein the substantially transparent material has a viscosity of about 50,000 centipoise or more at a shear rate of 0.1 $s^{-1}$.

4. The substantially transparent material of claim 1, wherein the particles are selected from the group consisting of barium titanate, strontium titanate, potassium titanate, lead titanate, barium zirconate, strontium zirconate, potassium zirconate, lead zirconate, and combinations thereof.

5. The substantially transparent material of claim 1, wherein the compound is selected from the group consisting of organic phosphates, organic phosphonates, organic phosphinates, and organic zirconates.

6. The substantially transparent material of claim 1, wherein the compound has a molecular weight of about 300 Daltons or more.

7. The substantially transparent material of claim 1, wherein the particles are bonded to the at least one compound via a bond selected from the group consisting of an electrostatic interaction, a covalent bond, a coordinative bond, and combinations thereof.

8. The substantially transparent material of claim 1, wherein the substantially transparent material further comprises particles of titanium dioxide, and wherein the particles of titanium dioxide have a median particle diameter of about 4 nm to about 15 nm, are uniformly dispersed in the at least one compound, and are bonded to the at least one compound via at least one surface functional group of the particles of titanium dioxide.

9. The substantially transparent material of claim 8, wherein about 80 vol. % or more of the particles of titanium dioxide have a particle diameter of about 20 nm or less.

10. The substantially transparent material of claim 8, wherein the titanium dioxide particles are bonded to the at least one compound via a bond selected from the group consisting of an electrostatic interaction, a covalent bond, a coordinative bond, and combinations thereof.

11. The substantially transparent material of claim 1, wherein the material further comprises a polymer, which forms a substantially homogeneous blend with the other components of the material.

12. The substantially transparent material of claim 11, wherein the polymer is selected from the group consisting of silicone polymers, polyarylene ethers, polyetheretherketone, polyetherketoneketone, polyetherimide, cyclized polyimides, fluorinated polyimides, polybenzimidazole, polybenzoxazole, polyolefins, polycarbonates, polyimides, polyesters, cyclic polyolefins, and elastomers.

13. The substantially transparent material of claim 1, wherein the substantially transparent material comprises a total of 0 wt. % to about 10 wt. % of any components other than the particles and the at least one compound, based on the total weight of the material.

14. The substantially transparent material of claim 1, wherein about 75% or more of light having a wavelength of 400 nm, directed to the composite material at a specular angle of 10°, passes through a thickness of 2 mm of the substantially transparent material.

15. The substantially transparent material of claim 1, wherein the substantially transparent material has a refractive index of about 1.5 or more.

* * * * *